(12) United States Patent
Mutoh

(10) Patent No.: US 7,618,766 B2
(45) Date of Patent: Nov. 17, 2009

(54) FLAME RETARDANT PHOTOIMAGABLE COVERLAY COMPOSITIONS AND METHODS RELATING THERETO

(75) Inventor: Tsutomu Mutoh, Utsunomiya (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 310 days.

(21) Appl. No.: 11/642,184

(22) Filed: Dec. 20, 2006

(65) Prior Publication Data

US 2007/0149635 A1 Jun. 28, 2007

Related U.S. Application Data

(63) Continuation-in-part of application No. 11/314,061, filed on Dec. 21, 2005, now abandoned.

(51) Int. Cl.
G03C 1/725 (2006.01)
G03C 1/73 (2006.01)
G03F 7/027 (2006.01)
G03F 7/029 (2006.01)

(52) U.S. Cl. .............. 430/281.1; 522/115; 522/83; 522/88; 522/71; 522/76; 522/78; 522/64; 430/286.1

(58) Field of Classification Search .......... 522/18, 522/28, 64, 31, 96, 171, 167, 71, 76, 83, 522/115; 430/281.1, 286.1
See application file for complete search history.

(56) References Cited

U.S. PATENT DOCUMENTS

| | | | |
|---|---|---|---|
| 2,850,445 A | 9/1958 | Oster | |
| 2,875,047 A | 2/1959 | Oster | |
| 2,927,024 A | 3/1960 | Woodward et al. | |
| 3,074,974 A | 1/1963 | Gebura | |
| 3,097,096 A | 7/1963 | Oster | |
| 3,097,097 A | 7/1963 | Oster et al. | |
| 3,145,104 A | 8/1964 | Oster et al. | |
| 3,427,161 A | 2/1969 | Laridon et al. | |
| 3,479,185 A | 11/1969 | Chambers et al. | |
| 3,549,367 A | 12/1970 | Chang et al. | |
| 3,579,339 A | 5/1971 | Chang et al. | |
| 3,622,334 A | 11/1971 | Matawan | |
| 3,645,772 A | 2/1972 | Jones | |
| 3,754,920 A | 8/1973 | Kuchta | |
| 3,776,270 A | 12/1973 | Roos | |
| 3,784,557 A | 1/1974 | Cescon | |
| 3,891,441 A | 6/1975 | Tsuji et al. | |
| 4,064,287 A | 12/1977 | Lipson et al. | |
| 4,071,367 A | 1/1978 | Collier et al. | |
| 4,127,436 A | 11/1978 | Friel | |
| 4,168,982 A | 9/1979 | Pazos | |
| 4,198,242 A | 4/1980 | Pazos | |
| 4,230,793 A | 10/1980 | Losert et al. | |
| 4,293,635 A | 10/1981 | Flint et al. | |
| 4,311,783 A | 1/1982 | Dessauer | |
| 4,341,860 A | 7/1982 | Sysak | |
| 4,376,815 A | 3/1983 | Oddi et al. | |
| 4,438,189 A | 3/1984 | Geissler et al. | |
| 4,477,556 A | 10/1984 | Dueber et al. | |
| 4,485,166 A | 11/1984 | Herwig et al. | |
| 4,621,043 A | 11/1986 | Gervay | |
| 4,622,286 A | 11/1986 | Sheets | |
| 4,710,262 A | 12/1987 | Weed | |
| 4,772,541 A | 9/1988 | Gottschalk et al. | |
| 5,536,620 A | 7/1996 | Dueber et al. | |
| 5,728,468 A * | 3/1998 | Schutyser et al. | ........... 428/415 |
| 5,728,505 A | 3/1998 | Dueber et al. | |
| 6,218,074 B1 | 4/2001 | Dueber et al. | |
| 6,506,814 B2 * | 1/2003 | Krongauz et al. | ............. 522/33 |
| 6,733,698 B2 * | 5/2004 | Hanson et al. | ............. 252/609 |
| 2004/0235992 A1 * | 11/2004 | Okada et al. | ................ 524/115 |

FOREIGN PATENT DOCUMENTS

| | | |
|---|---|---|
| JP | 1996123016 | 5/1996 |
| JP | 1997325490 | 12/1997 |
| JP | 1999237738 | 8/1999 |
| JP | 2001278952 | 10/2001 |
| JP | 2001339132 | 12/2001 |
| JP | 2002293882 | 10/2002 |
| JP | 2002296776 | 10/2002 |
| JP | 2003027028 | 1/2003 |
| JP | 2003027029 | 1/2003 |
| JP | 2003165898 | 6/2003 |
| JP | 2003268341 | 9/2003 |
| JP | 2003280188 | 10/2003 |
| JP | 2004-157188 A | 3/2004 |
| JP | 2004087923 | 3/2004 |

OTHER PUBLICATIONS

A. B. Cohen et al, Polymer Imaging, Chapter 7, in Neblette'S Supra, pp. 225-262.
R. Dessauer et al, Low Amplification Imaging Systems, Chapter 8, pp. 263-278.
D. F. Eaton, Dye Sensitized Photopolymerization, Phytochemistry, vol. 13:427-487, D. H. Volman et al., EDS., Wiley-Interscience, New York, 1986.
JP 2004 157188 A (Kanegafuchi Chemical Ind( Jun. 3, 2004 p. 36, paragraph 225, p. 38, paragraph 238, & Database WPI Week 200450, Derwent Publications Ltd., London, GB; AN 2004-520237 & JP 2004 157188 A (Kaneka Corp) Jun. 3, 2004 abstract.

* cited by examiner

Primary Examiner—Susan W Berman
(74) Attorney, Agent, or Firm—Konrad S. Kaeding

(57) ABSTRACT

The present invention is directed to phosphorus containing (or "halogen free") flame retardant photoimagable compositions useful as a coverlay material in a flexible electronic circuitry package. These compositions are generally photosensitive and comprise phosphorus containing acrylates and phosphorus-containing photo-initiators mixed with a polymer binder. The compositions of the present invention typically comprise elemental phosphorus in an amount between, and including, any two of the following numbers 2.0, 2.2, 2.4, 2.6, 2.8, 3.0, 3.2, 3.4, 3.6, 3.8, 4.0, 4.2, 4.4, 4.6, 4.8, 5.0, 5.2, 5.4, 5.6, 5.8 and 6.0 weight percent.

17 Claims, No Drawings

FLAME RETARDANT PHOTOIMAGABLE COVERLAY COMPOSITIONS AND METHODS RELATING THERETO

CROSS-REFERENCE TO RELATED APPLICATION

This application is a continuation-in-part of application Ser. No. 11/314,061, filed Dec. 21, 2005, incorporated by reference herein in its entirety.

BACKGROUND INFORMATION

1. Field of the Disclosure

The present invention relates generally to flame retardant electronic circuitry packaging. More specifically, the methods and compositions of the present invention are directed to the use of flexible, aqueous-processible, photoimagable coverlay compositions having little, if any, halogen (compared to conventional flame retardant coverlays), due at least in part to the use of a phosphorus based chemistry.

2. Description of Related Art

Photosensitive coverlay compositions can be generally referred to as "solder masks." These compositions are discussed broadly in U.S. Pat. No. 5,536,620 to Dueber et al. Flame retardant properties (i.e., flame retardancy) can be important in certain applications. Typically, halogenated materials have been used to make these materials flame retardant. However recently, increasing environmental concerns have required manufactures to make halogen-free flame retardant coverlay materials for flexible printed circuit board markets. Phosphorus containing materials have been the focus for these halogen-free flame retardant composition, however phosphorus "bleed" and poor flexibility have been two of the many problems identified. A need therefore exists to address such shortcomings.

SUMMARY

The present invention is directed to phosphorus containing flame retardant photoimagable compositions, having comparatively little, if any, halogen. The compositions of the present invention are generally useful as coverlay materials in flexible electronic circuitry packages. In one embodiment, the compositions of the present invention have a polymeric binder comprising: i. photosensitive compounds comprising a phosphorus moiety and an acrylate moiety; and/or ii. a phosphorus-containing photo-initiator. The compositions of the present invention typically comprise phosphorus in an amount between, and including, any two of the following numbers 2.0, 2.2, 2.4, 2.6, 2.8, 3.0, 3.2, 3.4, 3.6, 3.8, 4.0, 4.2, 4.4, 4.6, 4.8, 5.0, 5.2, 5.4, 5.6, 5.8 and 6.0 weight percent.

DETAILED DESCRIPTION

The following discussion is directed to the preferred embodiments of the present invention only, and nothing within the following disclosure is intended to limit the overall scope of this invention. The scope of the present invention is to be defined solely by the claims, as presented at the end of this specification.

The present invention is directed to compositions useful as coverlay materials for protecting fine line circuitry found on flexible substrates. These compositions contain be photoactive (i.e., light-active) materials making them useful in photolithographic processing. In addition, these materials are regarded as being flame retardant according to the applicable industry standards and do not employ conventional amounts of environmentally harmful halogen materials, i.e., the amount of halogen is equal to or less than 10,000, 5000, 1000, 500, 100, 50, 25, 10, 5, 2 or 1 ppm (parts per million) based upon weight.

In one embodiment of the present invention, the coverlay composition is placed over circuit traces as a sheet and vacuum-pressed, and/or roll-pressed, thereby bonding the coverlay onto the circuit traces. Here, 'coverlay passageways' can be formed via any conventional or non-conventional photo imaging process.

The photo imaging can be accomplished by applying electromagnetic radiation through a pattern (commonly called a photo mask), so the radiation exposes only certain pre-defined portions of the coverlay. The exposed portions will typically have much lower aqueous carbonate solubility properties than the remaining unexposed portions, due at least in part to crosslinking, chain extension, and other chemical reactions in the photo sensitive coverlay.

Thereafter, the coverlay can then be subjected to an aqueous carbonate removal process. The differential in solubility between the exposed and unexposed portions (due to photo imaging) will generally cause the unexposed portions of the coverlay to swell and dissolve (or otherwise be removed). As portions of the coverlay are removed, passageways (through the coverlay) can be formed, and then additional curing step is applied to yield a thermally cross-linked network. Subsequently, these passageways are typically filled with metal, via a metal deposition chemistry and process.

Generally speaking, the coverlay materials of the present invention employ the use of phosphorus containing monomers (and/or phosphorus containing oligomer materials) with a phosphorus containing photo-initiator. Typically, the phosphorus-containing monomer (or oligomer) is an acrylate. The compositions of the present invention typically comprise phosphorus in the total composition an amount between, and including, any two of the following numbers 2.0, 2.2, 2.4, 2.6, 2.8, 3.0, 3.2, 3.4, 3.6, 3.8, 4.0, 4.2, 4.4, 4.6, 4.8, 5.0, 5.2, 5.4, 5.6, 5.8 and 6.0 weight percent.

The combination of phosphorus-containing monomers (typically acrylates) and phosphorus-containing photo-initiators can create a polymer network, using actinic light radiation and free radical polymerization, whereby the phosphorus content of the total composition can be maximized (thus maximizing the physical attributes provided by phosphorus) without unduly compromising other physical properties. By polymerizing the compositions of the present invention in this manner, phosphorus can be fixed into a three-dimensional polymer network in order to make both a flame retardant and flexible coverlay material.

As used herein, the term "unsaturated phosphorus-containing monomer" is used to describe any acrylate monomer or acrylate oligomer (or acrylate polymer formed from either an acrylate monomer or acrylate oligomer or both) having at least one ethylenical double bond and having at least one atom of phosphorous. Typically, the compositions of the present invention can comprise phosphorus containing acrylates in an amount between and including any two of the following numbers 20, 25, 30, 35, 40, 45, 50, 55, 60, 65 and 70 weight percent of the total composition. For example, an ester based polymer precursor derived from a phosphate type compound can be prepared from phosphoric acid, or phosphoric acid derivatives, and alcohol or alcohol based derivatives. In addition, urethane acrylates and epoxy acrylates can be prepared from hydroxyl-group containing phosphorus derivatives based on phosphoric acid, phosphine oxide or phosphinates.

Some phosphorus-containing monomers include, but are not limited to, commercially available V-3PA® (manufactured by Osaka Organic Chemical), MR-260® (manufactured by Daihachi Chemical), PM-2® and PM-21® (manufactured by Nihon Kayaku), RAYLOK 1721® and RAYLOK 1722® (manufactured by Surface Specialties). The amount of acrylate functionality containing within the phosphorus-containing monomer can impact the flexibility of cured coverlay. In general, lower concentrations are generally preferred such as the concentration found using RAYLOK®1722 (where the molecular weight is about 1500). Higher concentrations of acrylate functionality can be used such as monomers like PM-2® (where the molecular weight is about 166) and V-3PA® (where the molecular weight is about 130). However where higher concentrations of acrylate functionality are used typically other flexible monomers, like urethane acrylate oligomers, are also used so that good flexibility of the final coverlay is maintained.

As used here, the term "phosphorus containing photo-initiator" is intended to mean a photo-initiator containing the phosphorus atom in its structure. In one embodiment, acylphosphine oxide photo-initiator is used as a 'alpha-cleavage' photo-initiator creating two free radicals upon irradiation and initiating free radical polymerization. In another embodiment, the phosphorus moiety of the phosphorus-containing photo-initiator is attached to the end of the photo-initiator compound to aid in polymerization with other components.

Typically, the compositions of the present invention can comprise phosphorus containing photo-initiator in an amount between and including any two of the following numbers 2.0, 3.0, 4.0, 5.0, 6.0, 7.0, 8.0, 9.0, 10.0, 12.0, 14.0, 16.0 and 18.0 weight percent of the total composition. Examples of useful phosphorus-containing photo-initiators include, but are not limited to, LUCIRIN TPO® and LUCIRIN TPO-L® and IRGACURE 819®. LUCIRIN TPO® and LUCIRIN TPO-L® are monoacylphosphine oxides. IRGACURE 819®, and its product family are bisacylphosphine oxides. In general, monoacylphosphine oxides can be useful due to their higher phosphorus content compared to bisacylphosphine oxides.

In one embodiment of the present invention, a phosphorous containing photo-initiator based on acylphosphine oxide can be used to initiate free radical polymerization with unsaturated double bonds found in a phosphorus containing acrylic monomer (or unsaturated phosphorous containing oligomer). The composition formed via this reaction can be described as a three-dimensional polymer network consisting of phosphorus incorporated into the network. Here, the phosphorus is incorporated into the polymer matrix from two sources, namely the unsaturated phosphorus-containing acrylate component and the phosphorus-containing photo-initiator component.

Introducing phosphorus using both of these components allows one to increase, to a sufficient level, the amount of phosphorus contained in the coverlay composition. This allows one to form a coverlay material that is flame-retardant (without the use of halogenated materials) while still maintaining a variety of other beneficial physical properties such as good flexibility.

In another embodiment of the present invention, derivatives of phosphine oxides (including phosphinates and phosphates) have been found to be useful. Typically, these materials can contain chemically reactive hydroxyl end groups that can incorporate with a thermal crosslinking agent like a blocked isocyanate. Here, phosphorus can be fixed into the polymer binders of present invention either through physical entanglement with the other components or by direct connection via a chemical bond. In another embodiment, alkaline developable resin containing chemically reactive carboxylic acid bond sites can also be used. In one instance, unsaturated double bonds positioned on polymer side chains can be useful in aiding polymerization of the binder and phosphorus-containing materials. In another instance, chemically reactive hydroxyl groups in the polymer binder can be used to aid in chemically reacting with a thermal crosslinking agent like a blocked isocyanates during thermal curing.

Useful derivatives of phosphine oxides include, but are not limited to, 1,4-cyclooctylenephosphonyl-1,4-benzene diol, 9-hydroxy-10-(2,5-dihydroxyphenyl)-9-oxo-10-phosphaphenanthorene-10-oxide, n-butyl-bis (3-hydroxypropyl) phosphine oxide, tris(3-hydroxypropyl)phosphine oxide, and 2-(9,10-dihydro-9-oxa-10-oxide-10-phosphananthrene-10-yl)methyl succinic acid bis-(2-hydroxyethyl)-ester.

In one embodiment of the present invention, the phosphorus-containing photo-initiator can be represented by the following formula,

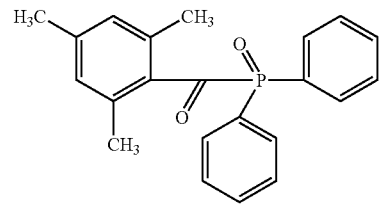

In another embodiment, the phosphorus-containing photo-initiator can be represented by the following formula,

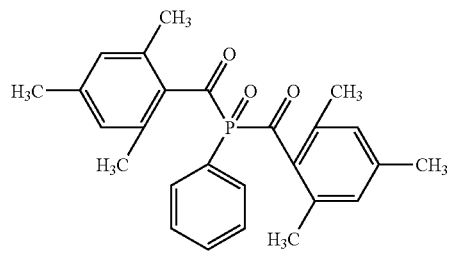

In one embodiment of the present invention a polymer binder (or oligomers of at least two repeating monomer units) having unsaturated double bonds, reactive carboxylic acid groups, or reactive hydroxyl end groups can be used. In general, reactive groups located on the polymer binders of the present invention can allow these polymers to react (or network) more completely with a phosphorus-containing monomer/oligomer and phosphorus-containing photo-initiator. Here, the phosphorus-containing monomers of the present invention can be effectively chemically connected into the polymer network. In general, carboxylic acid functionality can impart 'alkaline developability' (which can be desirable to many end-users) and hydroxyl end groups can act as an additional reaction site for thermal crosslinking agents including isocyanates.

In one embodiment of the present invention, acrylic co-polymers having any of these features can be particularly useful. Some of these acrylic co-polymers include, but are not limited to, glycidyl(meth)acrylate derivatives reacted with acid-containing acrylic co-polymer, and methacryloyl ethyl isocyanate reacted with hydroxyethyl acrylate (HEA) or 2-hydroxyethyl methacrylate (HEMA). (Meth)acrylic acid, and other acid containing (meth)acrylates (and other copolymerized acid containing materials) can also be useful. In another embodiment, modified epoxy resin prepared using a 2-step reaction (a reaction of epoxy resin and (meth)acrylic acid followed by a reaction between the resultant hydroxyl group and an acid anhydride) can also be a suitable polymer binder.

Photosensitive Compositions:

In many embodiments of the present invention, the compositions further comprise additional components. These components can be catalysts, adhesion promoters, other non-halogen flame retardant additives, other photo-initiators and the like. These components can be used to render the compositions reactive to thermal and/or radiant energy thereby making the compositions useful in a variety of photoimagable coverlay applications.

"Photo-active," which is synonymous with "photosensitive," describes a material that changes its chemical or physical nature, or causes such a change, upon exposure to actinic radiation, in such a way that the change is formed directly. Examples include an image, or a precursor (a latent image is formed which upon further treatment produces the desired change). Photo-active components can include, but are not limited to, photo-initiators, photo-sensitizers, photosolubilizers, photodesensitizer, photoinhibitor, phototackifier, photodetackifier, a component that is photodegradable, photochromic, photoreducible, photo-oxidizable, photoadhesive, photoreleaseable, photomagnetic, photodemagnetic, photoconductive, photoinsulative, combinations thereof, and materials that change refractive index upon exposure to actinic radiation. Such photosensitive compositions of this invention include:

(i) a polymerizable monomer, and
(ii) an initiating system activatable by actinic radiation.

"Thermally active" describes a material that changes its chemical or physical nature (or causes such a change) when its temperature is raised or when a substance is added or removed. Illustrative of such a photo active or thermally active component is a material which cyclizes, dimerizes, polymerizes, cross-links, generates a free radical, generates an ionic species or dissociates upon exposure to actinic radiation or when it is heated.

In one embodiment, the phosphorus compounds of the present invention are useful as components of photosensitive systems and particularly in photoimaging systems such as those described in "Light-Sensitive Systems: Chemistry and Application of Nonsilver Halide Photographic Processes" by J. Kosar, John Wiley & Sons, Inc., 1965 and more recently in "Imaging Processes And Materials—Neblette's Eighth Edition," edited by J. Sturge, V. Walworth and A. Shepp, Van Nostrand Reinhold, 1989. In such systems, actinic radiation impinges on a material containing a photoactive component to induce a physical or chemical change in that material. A useful image, or latent image, can be processed and produced. Typically actinic radiation useful for imaging is light ranging from the near ultraviolet through the visible spectral regions, but in some instances may also include infrared, deep-ultraviolet, X-ray and electron beam radiation.

Upon exposure to actinic radiation, the photo active component generally acts to change the rheological state, the solubility, the surface characteristics, refractive index, the color, the electromagnetic characteristics and/or other such physical or chemical characteristics of the photosensitive composition, such as is described in the Neblette's publication identified above.

The photosensitive compositions of this invention can be used in the form of a supported film or layer, although unsupported solid objects may also be prepared. The photosensitive composition can generally be applied to a suitable substrate to form a continuous film or layer thereon which can then be exposed to actinic radiation to form an image directly (or a latent image).

Alternatively, the supported layer may be uniformly exposed to actinic radiation to cure or harden the layer, particularly when the photosensitive composition is applied either in the form of a continuous or patterned layer, such as, a protective finish, a paint or ink. Any conventional source of actinic radiation may be used including arc, discharge, and incandescent lamps as well as lasers, X-ray and electron beam units. The layer may be applied as a solution and dried to a solid layer wherein any conventional coating or printing process may be used. Alternatively, the layer or film may be applied by laminating a supported solid photosensitive layer to the substrate and then optionally removing the support.

In some reversal imaging processes, the treatment step can be used to complete the formation of the latent image before or during development. Such systems include photopolymer systems, e.g., as disclosed in U.S. Pat. No. 4,198,242 to Pazos or U.S. Pat. No. 4,477,556 to Dueber et al. (both of which are hereby incorporated into this specification by reference, for teachings therein), containing a photoinhibitor wherein imaging exposure generates inhibitor in the exposed areas of the layer and a subsequent uniform exposure to actinic radiation, or in some instances uniformly heated, generates a latent image in the complimentary areas free of photogenerated inhibitor. Such reversal systems also include photodesensitizable systems, e.g., as disclosed in Roos U.S. Pat. No. 3,778,270, wherein, in the exposed areas, a component required for image or latent image formation is degraded or desensitized to an inactive form and the component in the unexposed areas is developed into an image or latent image by subsequent treatment with a reagent.

Illustrations of such photosensitive systems are described in Chapter 7, "Polymer Imaging" by A. B. Cohen and P. Walker in Neblette's supra, pages 226-262, in which photocrosslinking, photodimerization, photocyclization, photosolubilization, and both ionic and free radical photopolymerization, as well as electrostatic photopolymer imaging and solid imaging are discussed. In Chapter 8, "Low Amplification Imaging Systems" by R. Dessauer and C. E. Looney, pages 263-278, imaging systems discussed include color forming free radical, diazo, and vesicular systems, photochromism, phototackification and photodetackification as well as thermal and photothermal systems.

Photopolymerizable Compositions:

In one embodiment, the coverlay compositions of the present invention can be particularly useful as photopolymerizable compositions. In such systems, the phosphorus-containing monomer (or oligomer) can be partially reacted or crosslinked into the polymer network in order to impart other desirable physical and chemical characteristics to both the exposed and unexposed portions of a photopolymerizable composition. In one embodiment, exposure to actinic radiation can induce the photo-initiator system to begin a chain-propagated polymerization of the monomeric/oligomeric materials via a step-growth mechanism, or by a free radical addition polymerization reaction.

While many photopolymerizable mechanisms can be contemplated, the compositions and processes of the present invention can be described in the more general context of a free radical initiation and addition polymerization of monomers having one or more terminal ethylenically unsaturated groups. In this context the photo-initiator systems of the present invention, when exposed to actinic radiation, can act as a source of free radicals (the free radicals being needed to initiate polymerization of the monomer component).

In one embodiment of the present invention, acylphosphine oxide photo-initiator (such as LUCIRIN® TPO, TPO-L, IRGACURE®819, or combinations of these) can posses the proper UV absorption characteristic while more generally known photo-sensitizers may not typically absorb necessary portions of the radiation spectra. Thus, the effect described above can in many cases minimize the amount of non-phosphorus initiator that needs to be used in the total photo-initiator system (or package). In a broader sense, the term "photo active" can refer to any or all the essential materials needed for photopolymerization (i.e., the photo initiating system and the monomer). Photopolymerizable compositions can contain mono- or multi-functional phosphorus-containing acrylate/methacrylate monomer/oligomer as well as non-phosphorus acrylate/methacrylate monomer/oligomer if desired.

Additional Polymerizable Monomers:

Other suitable monomers useful as a co-monomer/oligomer in the compositions of the present invention include, but are not limited to the following, t-butyl acrylate, 1,5-pentanediol diacrylate, N,N'-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

A class of monomers/oligomers is alkylene or a polyalkylene glycol diacrylates prepared from an alkylene glycol of 2 to 15 carbons or a polyalkylene ether glycol of 1 to 10 ether linkages, and those disclosed in U.S. Pat. No. 2,927,024, e.g., those having a plurality of additional polymerizable ethylenic linkages particularly when present as terminal linkages. Preferred are those wherein at least one and preferably most of such linkages are conjugated with a double bonded carbon, including carbon double bonded to carbon and to such hetero atoms as nitrogen, oxygen and sulfur. Also preferred are such materials wherein the ethylenically unsaturated groups, especially the vinylidene groups, are conjugated with ester or amide structures.

A particularly preferred class of monomers/oligomers can be hexamethylene glycol diacrylate, ethoxlated 1,6-hexanediol diacrylate, acrylated aromatic/aliphatic urethane oligomer, bis-phenol A ethoxylated (10-30 mole) diacrylate/ dimethacrylate, polyethoxylated diacrylate/dimethacrylate, polypropoxylated diacrylate/dimethacrylate, polyester modified Bis-phenol A di-acrylate/di-methacrylate, triethylene glycol diacrylate, tripropylene glycol diacrylate, pentaerythritol triacrylate, trimethylolpropane triacrylate, polyoxyethylated trimethylolpropane triacrylate, Additional Suitable Photo-initiators:

Additional photo-initiators can be used in addition to the phosphorus-containing photo-initiators described above. These photo-initiators can have one or more compounds that directly furnish free-radicals when activated by actinic radiation. The total amount of photo-initiator also may contain a sensitizer that is activated by the actinic radiation, causing the compound to furnish the free-radicals.

Photo-initiator systems of the present invention can contain a photo-sensitizer that extends spectral response into the near ultraviolet, visible, and near infrared spectral regions. A large number of free-radical generating compounds, including redox systems such as Rose Bengal/2-dibutylaminethanol, may be selected to advantage. Photoreducible dyes and reducing agents such as those disclosed in U.S. Pat. Nos.: 2,850,445; 2,875,047; 3,097,096; 3,074,974; 3,097,097; 3,145,104; and 3,579,339; as well as dyes of the phenazine, oxazine, and quinone classes; ketones, quinones; 2,4,5-triphenylimidazolyl dimers with hydrogen donors, and mixtures thereof as described in U.S. Pat. Nos.; 3,427,161; 3,479,185; 3,549,367; 4,311,783; 4,622,286; and 3,784,557 can be used as initiators. Other initiators are dye-borate complexes disclosed in U.S. Pat. No. 4,772,541. A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427-487. Similarly, the cyclohexadienone compounds of U.S. Pat. No. No. 4,341,860 can be useful as initiators.

Reacting or Crosslinking Agents:

When the photopolymerizable composition is to be used as a permanent coating, such as a solder mask, a chemically or thermally activated reacting or crosslinking agent may be incorporated to improve high temperature characteristics, chemical resistance or other mechanical or chemical properties. Suitable reacting or crosslinking agents include those disclosed in U.S. Pat. No. 4,621,043 to Gervay, and U.S. Pat. No. 4,438,189 to Geissler et al., such as melamines, ureas, benzoguanamines, and the like.

Examples of suitable reacting or crosslinking compounds include: N-methylol compounds of organic carboxamides such as N,N'-dimethylourea, N,N'-dimethyloloxamide, N,N'-dimethylolmalonamide, N,N'-dimethylolsuccinimide, N,N'-dimethylolsebacamide, N,N',N"-trimethylolcitramide, 1,3-dimethylolimidazolidine-2-one, 1,3-dimethylol-4,5-dihydroxyimidazidine-2-one, 1,3-dimethylolperhydropyrimidine-2-one, trimethylolmelamine, tetramethylolmelamine, hexamethylolmelamine, 1,3-dimethylol-5-methylperhydro-1,3,5-triazine-2-one, 1,3-dimethylol-5-allylperhydro-1,3,5-triazine-2-one, 1,3-dimethylol-5-butylperhydro-1,3,5-triazine-2-one, 1,2-bis-[1,3-dimethylolperhydro-1,3,5-triazine-2- one-5-ylethane, tetramethylolhydrazine dicarboxamide, N,N'-dimethylolterephthalamide, N,NI-dimethylolbenzene-1,3-disulfonamide and tetramethylolglycoluril; and C-methylol compounds of phenols, phenol-ethers and aromatic hydrocarbons 2,4,6-trimethylolphenol, 2,6-dimethylol-4-methyloanisole, 2,6-dimethylol-4-methylphenol, 1,3-dimethylol-4,6-diisopropylbenzene, 2,2-bis-(4-hydroxy-3,5-dimethylolphenyl)propane, and 3,3'-dimethylol-4,4'-dihydroxydiphenyl sulfone.

Instead of the aforementioned methylol compounds, it is also possible to use, for example, the corresponding methyl, ethyl or butyl ethers, or esters of acetic acid or propionic acid. Suitable examples include: 4,4'-bismethoxymethyldiphenyl ether, tris-methoxymethyl-diphenyl ether, tetrakis-methoxymethyl hydrazinedicarboxamide, tetrakis-methoxymethyl-glycoluril, tetrakis-hydroxyethoxymethylglycoluril, bis-acetoxymethyldiphenyl ether, hexamethoxymethyl-melamine. In one embodiment, a preferred crosslinking agent of this class is hexamethoxymethyl melamine.

Other useful reacting or crosslinking agents are compounds containing two or more epoxy groups such as the bis-epoxides disclosed in U.S. Pat. No. 4,485,166 to Herwig et al. Suitable bis-epoxides include bis-glycidal ethers of dihydric alcohols and phenols such as bisphenol A, of polyethylene glycol and polypropylene glycol ethers of bisphenol A, of butane-1,4-diol, hexane-1,6-diol, polyethylene glycol, propylene glycol or polytetrahydrofurane. Bis-glycidyl ethers of trihydric alcohols, such as glycerol can also be used. Preferred reacting or crosslinking agents of this class are 2,2-bis-(4-glycidoxy-phenyl)-propane and 2,2-bis-(4-epoxy-ethoxy-phenyl)-propane.

Preferred reacting or crosslinking agents of this invention are blocked polyisocyanates. Upon heating a blocked polyisocyanate, blocking groups split off to yield a free reactive polyisocyanate. The free reacting polyisocynate can be easily reacted with a hydroxyl group, especially with a primary hydroxyl group to form a urethane linkage. Useful polyisocyanates in the present invention include toluene diisocyanate, isophorone diisocyanate, 1,4-naphthalene diisocyanate, 1,6-hexamethylene diisocyanate, tetramethyl xylene diisocyanate, bis(4-isocyanatocyclohexyl)methane and the like. Useful blocking groups are derived from caprolactam; diethyl malonate; alcohols; phenols; oximes, e.g., methyl ethyl ketoxime; and the like.

Adhesion Promoters:

When the photopolymerizable composition is to be attached to a metal surface, a heterocyclic or mercaptan compound may be added to improve adhesion of the composition to a metal.

Suitable adhesion promoters include heterocyclics such as those disclosed in U.S. Pat. No. 3,622,334 to Hurley et al., U.S. Pat. No. 3,645,772 to Jones, and U.S. Pat. No. 4,710,262 to Weed. Examples of useful adhesion promoters include benzotriazole, 5-chloro-benzotriazole, 1-chloro-benzotriazole, 1-carboxy-benzotriazole, 1-hydroxy-benzotriazole, 1,2-napthotriazole, benzimidazole, mercaptobenzimidazole, 5-nitro-2-mercaptobenimidazole, 5-amino-2-mercyptobenzimidazole, 2-amino-benzimidazole, 5-methyl-benzimidazole, 4,5-diphenyl-benzimidazole, 2-guanadino-benzimidazole, benzothiazole, 2-amino-6-methyl-benzothiazole, 2-mercaptobenzothiazole, 2-methyl-benzothiazole, benzoxazole, 2-mercaptobenzoxazole, 2-mercaptothiazoline, benzotriazole, 3-amino-1,2,4-triazole, 1H-1,2,4-triazole-3-thiol, 5-amino-1,3,4-thiodiazole-2-thiol, 4-mercapto-IH-pyrazolo[3,4-d]pyrimidine, 4-hydroxy-pyrazolo[3,4-d]pyrimidene, 5-amino-tetrazole monohydrate, tolutriazole, 1-phenyl-3-mercapototetrazole, 2-amino-thiazole, and thio-benzanilide.

Preferred adhesion promoters for use in photoresists and solder masks include 2-amino-5-mercaptothiophene, 5-amino-1,3,4-thiodiazole-2-thiol, benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol, and mercaptobenzimidazole.

Polymeric Modifiers

The photopolymerizable composition may (optionally) contain additional polymeric binders to modify adhesion, flexibility, hardness, oxygen permeability, moisture sensitivity and other mechanical or chemical properties required during its processing or end use. Such modifiers can be particularly useful in adjusting room temperature creep viscosity, so the coverlay compositions of the present invention can be stored in a rollstock form, without unwanted creep or deformation.

Suitable polymeric binders which can be used in combination with the binder of this invention include: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; polyvinyl pyrrolidone and copolymers, e.g., poly(vinyl pyrrolidone/vinyl acetate) saturated and unsaturated polyurethanes; synthetic rubbers, e.g., butadiene/acrylonitrile, acrylonitrile/butadiene/styrene, methacrylate/acrylonitrile/butadiene/styrene copolymers, and styrene/butadiene/styrene, styrene/isoprene/styrene block copolymers; high molecular weight polyethylene oxides of polyglycols having average molecular weights from about 4,000 to 1,000,000; copolyesters, e.g., those prepared from the reaction product of a polymethylene glycol of the formula $HO(CH_2)_nOH$ where n is a whole number 2 to 10 inclusive, and (1) hexahydroterephthalic, sebacic and terephthalic acids,
(2) terephthalic, isophthalic and sebacic acids,
(3) terephthalic and sebacic acids,
(4) terephthalic and isophthalic acids,
(5) mixtures of copolyesters prepared from said glycols
(6) terephthalic, isophthalic and sebacic acids
(7) terephthalic, isophthalic, sebacic and adipic acid; nylons or polyamides, e.g., N-methoxymethyl polyhexamethylene adipamide; cellulose esters, cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For aqueous development the photosensitive layer will be removed in portions which are not exposed to radiation but will be substantially unaffected during development by a liquid such as wholly aqueous solutions containing 1% sodium carbonate by weight. A specific, preferred class of polymeric binder modifiers are polyvinyl pyrrolidone polymers and copolymers thereof, and amphoteric polymers and copolymers thereof.

Plasticizers

The photopolymerizable compositions may also contain a plasticizer to modify adhesion, flexibility, hardness, solubility, and other mechanical or chemical properties required during its processing or end use. However, a dedicated plasticizer may not be necessary, particularly if plasticizer properties are obtained from other ingredients formulated into the coverlay for other purposes or functions.

Suitable plasticizers include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropylnaphthalene, poly(propylene glycol), glyceryl tributyrate, diethyl adipate, diethyl sebacate, dibutyl suberate, dioctyl phthalate, tricresyl phosphate, tributyl phosphate, tris(2-ethylhexyl)phosphate.

Fillers:

The photopolymerizable compositions may also contain suitable organic or inorganic fillers to improve flame retardant, thermal resistance, physical properties and the thixotropic nature of these compositions. For example, $Al(OH)_3$ and $Mg(OH)_2$ are well-known inorganic flame retardants. Zinc borate is another class of inorganic flame retardant fillers. Additional fillers useful in the present invention are microcrystalline thickeners as disclosed in U.S. Pat. No. 3,754,920, e.g., microcrystalline cellulose, microcrystalline silicas, clays, alumina, bentonite, kalonites, attapultites, and montmorillonites. Another class of fillers includes finely divided powders having a particle size of 5 nanometers to 50 microns, preferably 5 nanometers to 500 nanometers, as disclosed in U.S. Pat. No. 3,891,441, such as silicon oxide, titanium oxide, carbon black, zinc oxide, and other commercially available pigments.

Melamine polyphosphate, melamine cyanurate, ammonium polyphosphate, and some of organic phosphorus materials that cannot be dissolved in common organic solvent can be regarded as fillers in this invention.

Optional Components:

Other compounds conventionally (or even non-conventionally) can be added to photosensitive compositions to modify the physical properties of the film for a particular use. Such components include: other polymeric binders, fillers, thermal stabilizers, hydrogen donors, thermal crosslinkers, optical brighteners, ultraviolet radiation materials, adhesion modifiers, coating aids, and release agents. The photo polymerizable compositions may contain other components such as thermal polymerization inhibitors, dyes and pigments, optical brighteners and the like to stabilize, color or otherwise enhance the composition.

Thermal polymerization inhibitors that can be used in the photo polymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

Coating Liquids:

The photoimageable, permanent coating may be coated as a liquid onto the printed circuit substrate using any conventional coating process. The liquid may be a solution or a dispersion of the permanent coating composition wherein the solvent is removed sufficiently, after coating, to form a tack-free coverlay layer. The additional layer or layers are coated sequentially and dried. The liquids may be spray coated, roller-coated, spin-coated, screen-coated or printed as disclosed in the Coombs patent discussed above, in the DeForest patent discussed above, in U.S. Pat. No. 4,064,287 to Lipson et al., or in U.S. Pat. No. 4,376,815 to Oddi et al. The liquid, typically as a solution, may also be curtain coated as disclosed in U.S. Pat. No. 4,230,793 to Losert et al. In the instance where printed circuits are manufactured on a continuous web of film substrate, permanent coating liquid may be coated by any conventional (or non-conventional) web coating process.

Photoimageable Coverlay Process:

Photoimageable permanent coatings can be used as a solder mask to protect printed circuits during subsequent processing, primarily solder operations, and/or from environmental effects during use. Permanent coatings also are used as intermediate insulative layers, with or without development, in the manufacture of multilayer printed circuits.

In practice, the photoimageable multilayer coating composition, typically between 15 and 50 micrometers (0.6 and 2 mils) thick, is applied to a printed circuit substrate which typically is a printed circuit relief pattern on a substrate that is semi-rigid or flexible. The photoimageable coating compositions may be sequentially coated as liquids and dried between layers or may be applied as a pre-coated single layer or multilayer composition on a temporary support. The composition is applied to a printed circuit substrate with vacuum lamination. The applied photopolymerizable composition is then exposed to actinic radiation to harden or insolubilize exposed areas. Any unexposed areas are then completely removed typically with an alkaline, aqueous sodium or potassium carbonate developer solution which selectively dissolves, strips, or otherwise disperses the unexposed areas without adversely affecting the integrity or adhesion of the exposed areas. The developed permanent resist image is typically cured at 160° C. for 1 hour. After cure the circuit board has a cured permanent resist layer covering all areas except unexposed areas that have been removed by development. Electrical components are then connected via the openings in the solder mask via insertion into the through-holes or positioned on surface mount areas and soldered in place to form the packaged electrical component.

Permanent Coating Evaluation:

Printed circuits must withstand a variety of tests that are dependent on the application of the circuits, which in turn governs the type of material used as the circuit substrate. A stringent application is for flexible printed circuits which require a fold or bend for a particular space requirement, such as a camera or video cassette recorder (VCR), and may require the capability of surviving multiple bends, such as in a computer disc drive. In some applications a flexible circuit is combined with a rigid circuit to form a flex-rigid multilayer printed circuit. The end use tests for flexible circuits focus on adhesion and the capability to withstand a single fold or multiple bends. The process and several tests that are used to support the examples in this application are described below.

A pre-formed, dry-film, photopolymerizable coating is applied, after removal of a removable cover sheet, e.g., polyethylene or polypropylene used to protect the permanent coating element during storage, to the pre-cleaned copper printed circuit surface of the substrate with a SMVL vacuum laminator. Although the laminate is typically exposed to actinic radiation through the temporary support film, in some instances, the temporary support may be removed before imaging to improve resolution and other such properties.

Typically, when a dry film is laminated without a liquid assist to a printed circuit substrate having a low circuit relief, measures must be taken to eliminate entrapped air, e.g., from around circuit lines. Entrapped air is eliminated by the vacuum lamination process described in U.S. Pat. No. 4,127,436 to Fiel, or may be eliminated by the grooved roll lamination process described in U.S. Pat. No. 4,071,367 to Collier et al. A Solder Mask Vacuum Laminator (SMVL) is useful in eliminating entrapped air, but this laminator is limited to atmospheric pressure lamination force after the evacuation cycle. If higher pressure is needed, the SMVL lamination can be followed by a hot press lamination, or alternatively a vacuum press can be used for the lamination.

Flammability (UL94 TEST):

Specimens were tested in accordance with the UL 94 Thin Material Vertical Burning Test for classing resist coating materials as 94VTM-0, 94VTM-1 or 94VTM-2. The 94VTM-0 classification is the best rating, indicating significantly reduced flammability.

EXAMPLES

The advantages of the present invention are illustrated in the following examples. These examples are not intended to limit the scope of this invention. The compositions below are described in weight % for each ingredient used.

The following glossary contains a list of names and abbreviations for each ingredient used:

| | |
|---|---|
| LUCIRIN TPO ® | Diphenyl 2,4,6-trimethyl benzylphosphine oxide from BASF |
| RAYLOK 1722 ® | Phosphorus containing Polyester acrylate Oligomer, Mw = 3000, Functionality = 2, P-content = 5% from Surface Specialty Chem. |
| Viscoat 3PA ® | Tris Acryloyloxy ethyl phosphate from Osaka Organic Chem. |
| EBECRYL 9119 ® | 75% by weight solids of urethane di-acrylate from Surface Specialty Chem. |
| DESMODU BL3175 ® | Hexamethylene diisocyanate based polyisocyanate blocked with methyl ethyl ketoxime and dissolved at 75% solids in ethyl acetate |
| 5-ATT | 5-amino-1,3,4-thiadiazole-2-thiol from Aldrich Chemical Co. |
| 3-MT | 3-mercapto-1H,2,4-triazole from Esprit Chemical Co., Rockland, MA |
| CBT | Carboxy Benzotriazole |
| BASONYL ® Blue Green | Green dye from Crompton & Knowles Corp., Reading, PA |
| PO-4500 | n-Butyl-bis (3-hydroxypropyl) Phosphine Oxide from Nihon Kagaku |
| ADK STAB FP-700 ® | Oligomeric Phosphate from ADEKA |
| ZFR-1481 ® | Bis-phenol F Epoxy modified resin from Nihon Kayaku |
| Acrylic copolymer | MAA: 18%, Tg = 30 C., Mw = 80000 |
| Reactive acrylic copolymer 1 | MAA: 18%, HEMA: 5%, Reactive acrylate through urethane linkage: 7%, Tg = 30 C., Mw = 80000 |
| Reactive acrylic copolymer 2 | MAA: 18%, HEMA: 5%, Reactive acrylate through epoxy linkage: 7%, Tg = 30 C., Mw = 80,000 |
| BF013S ® | Al(OH)3 from Nihon KeiKinzoku |

Example 1

Each coating solution was coated on 19 um Teijin G2 to have 50 um dried thickness. Coatings were vacuum laminated to a chemically cleaned PYRALUX TM® with a solder mask vacuum laminator at 50° C. Time to clear (TTC) in 1% aqueous sodium carbonate at 40° C. was determined. The optimum exposure that is required to obtain 7 steps in SST21 of polymer image after development using a SST21 wedge photo mask was determined. This optimum exposure was used for the EXAMPLES 1-3. Samples were exposed, developed at 2 times the time to clear unexposed material, and the developed samples were air dried and cured at 160° C. for one hour. The processed samples were tested with immersion in 10% sulfuric acid at 30° C. for 20 min.

| Ingredient | % by Weight |
|---|---|
| Reactive acrylic copolymer 1 | 31.00 |
| RAYLOK 1722 ® | 47.00 |
| EBECRYL 9119 ® | 2.00 |
| PO-4500 | 6.00 |
| DESMODUR BL3175 ® | 6.83 |
| LUCIRIN TPO ® | 7.00 |
| Sevron Blue | 0.04 |
| 5-ATT | 0.13 |

This sample passed UL94VTM-0 flame retardancy testing on 25 um KAPTON® E.

Example 2

This EXAMPLE was prepared in accordance with the procedure of EXAMPLE 1. The ingredients used were changed as follows:

| Ingredient | % by Weight |
|---|---|
| Reactive acrylic copolymer 1 | 21.00 |
| ZFR1481 ® | 10.00 |
| RAYLOK 1722 ® | 47.00 |
| EBECRYL 9119 ® | 2.00 |
| PO-4500 | 6.00 |
| DESMODUR BL3175 ® | 6.83 |
| LUCIRIN TPO ® | 7.00 |
| Sevron Blue | 0.04 |
| 5-ATT | 0.13 |

This sample passed UL94VTM-0 flame retardancy testing on 25 um KAPTON® E.

Example 3

This EXAMPLE was prepared in accordance with the procedure of EXAMPLE 1. The ingredients used were changed as follows:

| Ingredient | % by Weight |
|---|---|
| Reactive acrylic copolymer 2 | 31.00 |
| RAYLOK 1722 ® | 44.00 |
| Viscoat 3PA | 5.00 |
| EBECRYL 9119 ® | 2.00 |
| PO-4500 | 4.00 |
| DESMODUR BL3175 ® | 6.83 |

-continued

| Ingredient | % by Weight |
| --- | --- |
| LUCIRIN TPO ® | 7.00 |
| Sevron Blue | 0.04 |
| 3-MT | 0.08 |
| CBT | 0.05 |

This samples passed UL94VTM-0 flame retardancy testing on 25 um KAPTON® E.

Example 4

This EXAMPLE was prepared in accordance with the procedure of EXAMPLE 1. The ingredients used were changed:

| Ingredient | % by Weight |
| --- | --- |
| Reactive acrylic copolymer 1 | 28.00 |
| RAYLOK 1722 ® | 48.00 |
| EBECRYL 9119 ® | 2.00 |
| DESMODUR BL3175 ® | 4.88 |
| LUCIRIN TPO ® | 6.00 |
| Sevron Blue | 0.03 |
| 5-ATT | 0.09 |
| BF013S | 11.00 |

This sample passed UL94VTM-0 flame retardancy testing on 25 um KAPTON® E.

Comparative Example 1

This COMPARATIVE EXAMPLE indicates the need for reactive phosphorus compound such as a phosphorus containing acrylate oligomer to provide good photo-properties as well as cured properties such as acid resistance. Non-reactive oligomeric phosphate (ADKA STAB FP-700) was added to the composition at the expense of a reactive phosphorus acrylate oligomer (RAYLOK® 1722) with same level of total Phosphorus content.

| Ingredient | % by Weight |
| --- | --- |
| Reactive acrylic copolymer 1 | 31.00 |
| RAYLOK 1722 ® | 38.00 |
| EBECRYL 9119 ® | 2.00 |
| ADKA STAB FP-700 | 15.00 |
| DESMODUR BL3175 ® | 6.83 |
| LUCIRIN TPO ® | 7.00 |
| Sevron Blue | 0.04 |
| 5-ATT | 0.13 |

While the sample did pass flame retardancy testing, too much non-photo-reactive phosphorus component cause the sample to have poor photo-performances and poor acid resistance.

Comparative Example 2

This COMPARATIVE EXAMPLE indicates the need for Blocked Isocyanate (DESMODUR BL3175®) to connect hydroxyl group containing Phosphorus compound (PO-4500) during thermal curing to have better cured properties.

| Ingredient | % by Weight |
| --- | --- |
| Reactive acrylic copolymer 1 | 31.00 |
| RAYLOK 1722 ® | 50.00 |
| EBECRYL 9119 ® | 5.83 |
| PO-4500 | 6.00 |
| LUCIRIN TPO ® | 7.00 |
| Sevron Blue | 0.04 |
| 5-ATT | 0.13 |

While this sample passed flame retardancy testing and had good Photo-properties, the sample was not functional due to poor acid resistance.

Comparative Example 3

This COMPARATIVE EXAMPLE indicates the need for the reactive binder to have better overall chemical resist properties.

| Ingredient | % by Weight |
| --- | --- |
| Acrylic copolymer | 31.00 |
| RAYLOK 1722 ® | 47.00 |
| EBECRYL 9119 ® | 2.00 |
| PO-4500 | 6.00 |
| DESMODUR BL3175 ® | 6.83 |
| LUCIRIN TPO ® | 7.00 |
| Sevron Blue | 0.04 |
| 5-ATT | 0.13 |

While this sample passed flame retardancy testing, had suitable photo-properties and sufficient acid resistance, all three of these properties were inferior compared to samples employing a reactive acrylic co-polymer.

Comparative Example 4

This COMPARATIVE EXAMPLE indicates the need for a certain level of phosphorus content is generally required to achieve a VTM-0 class flame retardant level.

| Ingredient | % by Weight |
| --- | --- |
| Reactive acrylic copolymer 1 | 31.00 |
| RAYLOK 1722 ® | 27.00 |
| EBECRYL 9119 ® | 22.00 |
| PO-4500 | 6.00 |
| DESMODUR BL3175 ® | 6.83 |
| LUCIRIN TPO ® | 7.00 |
| Sevron Blue | 0.04 |
| 5-ATT | 0.13 |

While this sample passed a bend and crease test, had sufficient acid resistance and sufficient photo-properties, the sample was not flame retardant.

What is claimed is:
1. A photosensitive circuit coverlay composition consisting essentially of:
 a. an unsaturated phosphorus-containing monomer said monomer being a mono-functional or multi-functional methacrylate or acrylate being present in an amount between and including 20 and 70 weight percent of the total composition,
b. a phosphorus containing photo-initiator present in an amount between and including 2 and 18 weight percent of the total composition,
c. a polymer binder having an unsaturated bond, a carboxylic acid group, or a hydroxyl group, and
d. a blocked isocyanate or blocked polyisocyanate thermal crossliniking agent,
wherein the total composition has a halogen content of less than 100 parts per million based upon weight and has a phosphorus content in an amount between, and including 2.0, and 6.0 weight percent.

2. A composition in accordance with claim 1 wherein the polymer binder is an acrylic, or epoxy modified acrylic polymer.

3. A composition in accordance with claim 1 wherein the phosphorus containing monomer is an acrylate that, under radical polymerization, forms a three-dimensional polymer network.

4. A composition in accordance with claim 1, wherein the phosphorus containing monomer is present in an amount between and including 30 and 60 weight percent of the total composition.

5. A composition in accordance with claim 1 wherein the phosphorus containing photo-initiator comprises a phosphine oxide or acrylphosphine oxide.

6. A composition in accordance with claim 1 wherein the phosphorus containing photo-initiator has the chemical structure,

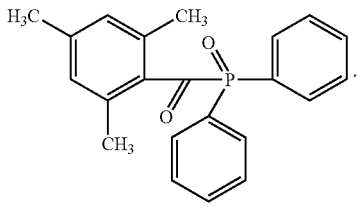

7. A composition in accordance with claim 1 wherein the phosphorus containing photo-initiator has the chemical structure,

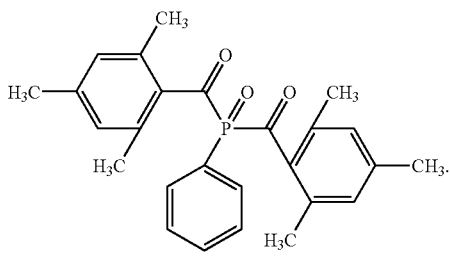

8. A composition in accordance with claim 1 wherein the phosphorus containing photo-initiator is present in an amount between and including the following numbers 4.0 and 8.0 weight percent of the total composition.

9. A composition in accordance with claim 1 wherein the thermal crosslinking agent (d) is a blocked polyisocyanate that upon heating forms a polyisocyanate selected from the group consisting of toluene diisocyanate, isophorone diisocyanate, 1,4-naphthalene diisocyanate, 1,6-hexamethylene diisocyanate, tetramethyl xylene diisocyanate, bis (4-isocyanatocyclohexyl) methane.

10. A composition in accordance with claim 1 further consisting essentially of a phosphorus containing material prepared from a phosphorus containing material further comprising a hydroxyl group.

11. A composition in accordance with claim 10 wherein the phosphorus containing material, under thermal reaction or crossliniking, can polymerize with the phosphorus containing acrylate and polymer binder.

12. A composition in accordance with claim 1 further consisting essentially of a filler selected from the group consisting of aluminum hydroxide, magnesium hydroxide, zinc borate, micro crystalline cellulose, micro crystalline silicas, clays, alumina, bentonite, kalonites, attapultites, montmorillonites, silicon oxide, titanium oxide, carbon black, zinc oxide, melamine polyphosphate, melamine cyanurate, and ammonium polyphosphate, wherein the filler has a particle size from 5 nanometers to 10,000 nanometers.

13. A composition in accordance with claim 1 further consisting essentially of a photo-active component wherein the photo active component is selected from the group consisting of photo-sensitizers, photosolubilizers, photodesensitizer, photoinhibitor, phototackifier, photodetackifier, a component that is photodegradable, photochromic, photoreducible, photo-oxidizable, photoadhesive, photoreleaseable, photomagnetic, photodemagnetic, photoconductive, photoinsulative, combinations thereof, and materials that change refractive index upon exposure to actinic radiation.

14. A composition in accordance with claim 1 further consisting essentially of an adhesion promoter.

15. A composition in accordance with claim 14 wherein the adhesion promoter is selected from the group consisting of 2-amino-5-mercaptothiophene, 5-amino-1,3,4-thiodiazole-2-thiol, benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol and mercaptobenzimidazole.

16. A composition in accordance with claim 1 wherein the composition is flame retardant according to UL 94 Thin Material Vertical Burning Test 94VTM-0, UL 94 Thin Material Vertical Burning Test 94VTM-1 or UL 94 Thin Material Vertical Burning Test 94VTM-2.

17. A composition in accordance with claim 1 wherein the polymer binder is an oligomer.

* * * * *